United States Patent
Lee

(10) Patent No.: US 10,271,435 B2
(45) Date of Patent: Apr. 23, 2019

(54) METHOD FOR COATING DEVICES AND RESULTING PRODUCTS

(71) Applicant: Nanoshield Technology Co. Ltd., Taipei (TW)

(72) Inventor: James Cheng Lee, Diamond Bar, CA (US)

(73) Assignee: Nanoshield Technology Co., Ltd., Taipei (TW)

( * ) Notice: Subject to any disclaimer, the term of this patent is extended or adjusted under 35 U.S.C. 154(b) by 0 days.

(21) Appl. No.: 15/612,357

(22) Filed: Jun. 2, 2017

(65) Prior Publication Data

US 2017/0367192 A1    Dec. 21, 2017

Related U.S. Application Data

(60) Provisional application No. 62/367,838, filed on Jul. 28, 2016, provisional application No. 62/357,550, (Continued)

(51) Int. Cl.
  *H05K 5/00* (2006.01)
  *H05K 7/00* (2006.01)
  (Continued)

(52) U.S. Cl.
  CPC ............. *H05K 3/284* (2013.01); *H05K 1/185* (2013.01); *H05K 3/285* (2013.01); *H05K 3/303* (2013.01);
  (Continued)

(58) Field of Classification Search
  CPC ... H05K 1/11; H05K 1/16; H05K 1/18; H05K 1/181; H05K 1/182; H05K 1/183;
  (Continued)

(56) References Cited

U.S. PATENT DOCUMENTS 8,148,830 B2    4/2012  Bedinger et al.
2006/0275611 A1  12/2006  Nishimura
(Continued)

FOREIGN PATENT DOCUMENTS

CN     101733028 A    6/2010
EP       2604364 A1    6/2013
(Continued)

OTHER PUBLICATIONS

European Search Report issued in connection with European patent application No. 17153614.7, dated Jul. 5, 2017, 12 pages.
(Continued)

*Primary Examiner* — Binh B Tran
(74) *Attorney, Agent, or Firm* — Duane Morris LLP

(57) ABSTRACT

A method for waterproofing a device and the resulting device are provided. The device includes a printed circuit board assembly (PCBA), which includes a printed circuit board, and at least one electronic component disposed on the printed circuit board. A waterproof coating such as a polymer coating is disposed on or in contact with at least one portion of the at least one electronic component. A nanofilm is disposed on the PCBA. The nanofilm includes an inner coating and an outer coating. The inner coating is disposed on the printed circuit board or in contact with the waterproof coating. The inner coating comprises metal oxide nanoparticles having a particle diameter in a range of about 5 nm to about 100 nm. The outer coating in contact with the inner coating, and comprises silicon dioxide nanoparticles having a particle diameter in a range of 0.1 nm to 10 nm.

12 Claims, 8 Drawing Sheets

Related U.S. Application Data filed on Jul. 1, 2016, provisional application No. 62/351,590, filed on Jun. 17, 2016.

(51) Int. Cl.
  *H05K 1/18* (2006.01)
  *H05K 3/28* (2006.01)
  *H05K 3/30* (2006.01)

(52) U.S. Cl.
  CPC ........... *H05K 2201/0104* (2013.01); *H05K 2201/015* (2013.01); *H05K 2201/0158* (2013.01); *H05K 2201/0179* (2013.01); *H05K 2201/0257* (2013.01); *H05K 2203/1333* (2013.01)

(58) Field of Classification Search
  CPC ......... H05K 1/186; H05K 7/02; H05K 1/024; H05K 1/03; H05K 1/0306; H05K 1/097
  USPC ......... 361/748, 760–783; 174/250, 251, 256, 174/260
  See application file for complete search history.

(56) References Cited

U.S. PATENT DOCUMENTS

| | | |
|---|---|---|
| 2007/0295389 A1 | 12/2007 | Capps et al. |
| 2008/0248263 A1 | 10/2008 | Kobrin |
| 2009/0192255 A1 | 7/2009 | Lin et al. |
| 2012/0040577 A1 | 2/2012 | Kissel et al. |
| 2012/0202047 A1 | 9/2012 | Welch et al. |
| 2014/0078422 A1* | 3/2014 | Tanabe ............ B32B 7/02 349/12 |
| 2015/0197642 A1* | 7/2015 | Boday ............ H05K 3/284 361/765 |
| 2016/0024313 A1 | 1/2016 | Boday et al. |

FOREIGN PATENT DOCUMENTS

| | | |
|---|---|---|
| WO | 2012/047691 A2 | 4/2012 |
| WO | 2012/125247 A1 | 9/2012 |

OTHER PUBLICATIONS

Extended European Search Report issued in connection with European patent application No. 17153614.7, dated Nov. 6, 2017, 15 pages.

Extended European Search Report issued in connection with corresponding European patent application No. 17176251.1, dated Nov. 20, 2017, 7 pages.

* cited by examiner

Results

|  | Size (d.n... | % Intensity: | St Dev (d.n... |
|---|---|---|---|
| Peak 1: | 33.00 | 67.4 | 10.29 |
| Peak 2: | 127.4 | 16.6 | 31.98 |
| Peak 3: | 3.073 | 14.5 | 0.5126 |

Results

| | Size (d.n... | % Intensity: | St Dev (d.n... |
|---|---|---|---|
| Peak 1: | 36.48 | 66.1 | 15.90 |
| Peak 2: | 207.2 | 19.0 | 80.42 |
| Peak 3: | 3.300 | 12.3 | 0.6994 |

Results

|  | Size (d.n... | % Intensity: | St Dev (d.n... |
|---|---|---|---|
| Peak 1: | 32.04 | 62.3 | 13.99 |
| Peak 2: | 114.3 | 24.2 | 36.43 |
| Peak 3: | 2.677 | 11.6 | 0.6028 |

METHOD FOR COATING DEVICES AND RESULTING PRODUCTS

PRIORITY CLAIM AND CROSS-REFERENCE

The present application is based upon and claims priority to U.S. Provisional Application No. 62/351,590 filed Jun. 17, 2016, U.S. Provisional Application No. 62/357,550 filed Jul. 1, 2016, and U.S. Provisional Application No. 62/367,838 filed Jul. 28, 2016, all of which are expressly incorporated by reference herein in their entireties.

FIELD OF THE INVENTION

The disclosed subject matter generally relates to a method for coating a device, and more particularly to a method for coating a device with nanoparticles, and the resulting coated device.

BACKGROUND

With the progress of a large variety of technologies, many electronic components have developed gradually along the microminiaturization and the diversification, and a design of a printed circuit board assembly (PCBA) with the electronic components thereon is more complex. Therefore, it is important to decide what way to protect the PCBA from being moistened by some exterior chemicals, the quality of protection usually determines the operating life of the PCBA. In order to solve the problem that the PCBA could be moistened, it usually forms a protective film on the PCBA in prior arts. In addition, some other devices may need a protective film for keeping from being moistened and less friction, such as, some cables.

However, a prior art technology usually uses a coating process to protect the PCBA and the other devices, but the traditional coating process is easy to make a thickness of the protective film too thick or with non-uniform distribution. Another prior art technology employs a vapor deposition process to form the protective film on the PCBA, but the vapor deposition process often makes the protective film not be uniform because of placed angles of the electronic components. Therefore, a method forming a thinner protective film with high quality protection function and more uniform distribution is required.

SUMMARY OF THE INVENTION

The present disclosure provides a method for waterproofing a device, and the resulting device. The method comprises forming a waterproof coating on the device, and forming a nanofilm on the device. The method of forming a waterproof coating and a nanofilm is provided in the present disclosure to solve the problems mentioned above.

An object of the present disclosure is to provide a method for coating a device. Such a method comprises steps of: forming a waterproof coating (such as a polymer coating) on or in contact with at least one portion of a device, forming an inner coating comprising (or being made from) metal oxide nanoparticles in contact with the waterproof coating and/or the device, and forming an outer coating in contact with the inner coating. The outer coating comprises (or is made) from silicon dioxide nanoparticles. The metal oxide nanoparticles have a suitable dimension, for example, having diameters in a range of from about 5 nm to about 100 nm. The silicon dioxide nanoparticles, have a suitable dimension, for example, diameters in a range of from about 0.1 nm to about 10 nm. In each of the inner and the outer coatings, nanoparticles may be bonded or fused together with each other, and may be in agglomerates. The metal oxide nanoparticles and silicon nanoparticles may be bonded or fused together with each other in the interface between the inner coating and outer coating.

In some embodiments, the method comprises steps of: applying a waterproof coating (such as a polymer coating) on or in contact with at least one portion of a device; curing the waterproof coating; baking the device; applying a first solution with metal oxide nanoparticles as a first solute on the device, the metal oxide nanoparticles having diameters in a range of from about 5 nm to about 100 nm; forming an inner coating having the metal oxide nanoparticles on the device by at least one of volatilization and pyrolysis of a first solvent of the first solution; strengthening a binding force between the metal oxide nanoparticles and the device; baking the device with the inner coating; applying a second solution with silicon dioxide nanoparticles as a second solute on the inner coating, the silicon dioxide nanoparticles having diameters in a range of from about 0.1 nm to about 10 nm; and providing the silicon dioxide nanoparticles on the inner coating as an outer coating by at least one of volatilization and pyrolysis of a second solvent of the second solution.

Another object of the present disclosure is to provide a method for coating a printed circuit board assembly (PCBA). Such a method comprises steps of forming a forming a waterproof coating (such as a polymer coating) on or in contact with at least one portion of the PCBA, forming an inner coating comprising metal oxide nanoparticles in contact with the waterproof coating and/or the PCBA, and forming an outer coating in contact with the inner coating, as described herein.

In some embodiments, the method comprises steps of: applying a waterproof coating on at least one portion of the PCBA; curing the waterproof coating; baking the PCBA at a temperature in a range of from about 50 degree to 150 degree for a period of time in a range of 10-30 minutes; applying a first solution with metal oxide nanoparticles as a first solute on the PCBA, the metal oxide nanoparticles having diameters in a range of from about 5 nm to about 100 nm; baking the PCBA with the first solution at a temperature in a range of from about 50 degree to about 150 degree for a period of time in a range of 5-30 minutes for leaving the metal oxide nanoparticles on the PCBA as an inner coating; strengthening a binding force between the metal oxide nanoparticles and the PCBA; baking the PCBA with the inner coating at about 50 degree to 150 degree for 10-30 minutes; applying a second solution with silicon dioxide nanoparticles as a second solute on the inner coating, the silicon dioxide nanoparticles having diameters in a range of from about 0.1 nm to about 10 nm; and baking the PCBA with the second solution at a temperature in a range of from about 50 degree to about 150 degree for a period of time in a range of 10-30 minutes for leaving the silicon dioxide nanoparticles on the inner coating as an outer coating.

Another object of the present disclosure is to provide a resulting coated device such as a printed circuit board assembly (PCBA) with waterproof function. The PCBA comprises a printed circuit board and at least one electronic component disposed or mounted on the printed circuit board. A waterproof coating comprising a polymer is disposed on or in contact with at least one portion of the electronic component. A nanofilm is disposed on or in contact with the waterproof coating and/or the PCBA. The nanofilm comprises an inner coating comprising metal oxide nanoparticles, and an outer coating comprising silicon dioxide nanoparticles. In some embodiments, the metal oxide nanoparticles have diameters in a range of from about 5 nm to about 100 nm and the silicon dioxide nanoparticles have diameters in a range of from about 0.1 nm to about 10 nm.

After being coated, the device comprises the waterproof coating and the nanofilm mainly composed of the metal oxide nanoparticles and the silicon dioxide nanoparticles with smaller diameter than that of the metal oxide nanoparticles. The polymer-containing waterproof coating and the nanofilm achieve a good waterproof effect to protect the device from being moistened. In some embodiments, the nanofilm can make the device has less friction or other functions. Furthermore, the nanofilm in the present disclosure has a thin thickness, and a continuous and uniform surface because of the nanometer-level sizes of the metal oxide nanoparticles and the silicon dioxide nanoparticles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1:
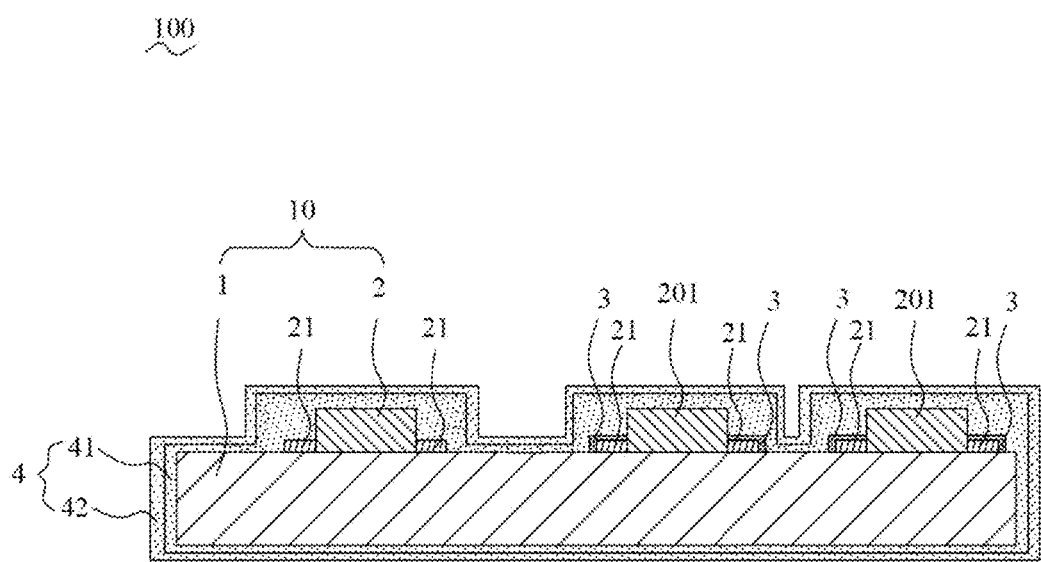
FIG. 1 is a schematic diagram of an exemplary coated printed circuit board assembly (PCBA) with a nanofilm in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a PCBA" is a reference to one or more of such structures and equivalents thereof known to those skilled in the art, and so forth. Furthermore, when a sentence is recited "at least one of A, B and C", it can be interpreted to mean that any combination. For example, may be only "A", or "B", or "C", or "A and B", or "A and C", or "B and C", or "A and B and C."

When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like.

In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Unless expressly indicated otherwise, references to "metal oxide" made below will be understood to encompass any suitable oxide of any suitable metal. Examples of suitable metal oxides include but are not limited to the oxides of a metal (or a combination thereof) selected from the following groups: (1) Al, Ga, In, Sn, Tl, Pb, and Bi ("poor metals"); (2) the first series of transition metals (first d block series) including Sc, Ti, V, Cr, Mn, Fe, Co, Ni, Cu, and Zn; (3) the second series of transition metals (second d block series) including Y, Zr, Nb, Mo, Tc, Ru, Rh, Pd, Ag, and Cd; and (4) the third series of transition metals (third d block series) including Lu, Hf, Ta, W, Re, Os, Ir, Pt, Au, and Hg. More preferably, the metal for the metal oxide or oxides is selected from Al, Ti, Cr, Mn, Co, Zn, Mo, Rh, Pd, Ag, W and Au. For example, a suitable metal oxide is $TiO_2$ in some embodiments.

A method for waterproofing a device and the resulting device are provided. Such a method comprises steps of providing a device comprising a PCBA including a printed circuit board and at least one electronic component disposed on the printed circuit board, forming a waterproof coating on or in contact with at least one portion of the at least one electronic component, forming an inner coating of a nanofilm on the printed circuit board or in contact with the waterproof coating, and forming an outer coating of the nanofilm in contact with the inner coating.

In some embodiments, the step of forming a waterproof coating comprises applying a polymer material onto at least one portion of the at least one electronic component on the device, and curing the polymer material on the device. The polymer material is selected from the group consisting of silicone, acrylic, urethane, epoxy, fluoropolymer, polyolefin, rubber, chlorobutyl rubber, polyethylene rubber copolymer, and any combination thereof. The polymer material may be applied in a form selected from a solution, viscous liquid or colloid, by brushing, spin-coating or a selective-coating process. The polymer material may be cured by a method selected from baking, UV irradiation, room temperature curing, or moisture curing. After the waterproof coating is formed, the device may be baked at a temperature, for example, in a range of from about 50° C. to about 150° C. for a period of time, for example, 10-30 minutes.

In some embodiments, the step of forming the inner coating of the nanofilm comprises applying a first solution onto the device, the first solution comprising metal oxide nanoparticles and a first solvent, removing the first solvent to form the inner coating with the metal oxide nanoparticles on the device by at least one of volatilization and pyrolysis techniques; and strengthening a binding force between the metal oxide nanoparticles and the device through a burn-in treatment. The metal oxide nanoparticles having a particle diameter in a range of about 5 nm to about 100 nm. In some embodiments, the first solution comprises about 0.3-5 wt. % of the metal oxide nanoparticles. The first solvent is one of water, methanol and ethanol, or a combination thereof. The first solvent is removed by heating the device at a temperature, for example, in a range of about 50° C. to about 150° C. for a period of time in a range of, for example, 5-30 minutes. The burn-in treatment is performed at a temperature in a range of from about 25° C. to about 100° C. for a period of time in a range of from about 2 hours to 72 hours in some embodiments. After the inner coating is formed, the device may be baked at a temperature in a range of about 50° C. to about 150° C. for a period of time in a range of 10-30 minutes.

In some embodiments, the step of forming the outer coating of the nanofilm comprises applying a second solution to the device, and removing the second solvent to form the outer coating using at least one of volatilization and pyrolysis techniques. The second solution including silicon dioxide nanoparticles and a second solvent. The silicon dioxide nanoparticles have a particle diameter in a range of from about 0.1 nm to about 10 nm. In some embodiments, the second solution comprises about 0.3 wt. % to 5 wt. % of silicon oxide nanoparticles, and the second solvent is a mixture of heptane, cetane and methyl hydrogen siloxane. The percentage of hydrogen from —SiH in methyl hydrogen siloxane may be in the range of from about 0.5 wt. % to 2.0 wt. %. In some other embodiments, the second solvent comprises amino modified siloxane or amino modified silane. Such amino modified siloxane or silane may optionally comprise —OH groups or may react with water or moisture to generate —OH groups. The second solvent is removed by heating the device at a temperature, for example, in a range of from about 50° C. to about 150° C. for a period of time, for example, of 10-30 minutes.

The first solution and the second solution are applied on the device by a method selected from dipping, spraying or brushing. The method may further comprise checking the appearance of the device with the inner coating and cleaning the device with the inner coating after strengthening the binding force between the metal oxide nanoparticles and the device and before baking the device with the inner coating. In inner and outer coatings, nanoparticles may be bonded or fused together with each other. The nanoparticles may be in agglomerates. The metal oxide nanoparticles and silicon nanoparticles may be bonded or fused together with each other in the interface between the inner coating and outer coating.

In some embodiments, the device is a printed circuit board assembly (PCBA). The PCBA comprises a printed circuit board and a plurality of electronic components mounted thereon. At least one of the electronic components is selected from electronic components having high electric potential difference. The electronic component having a high electric potential difference has at least one pin for electrically connecting with the printed circuit board. The electronic component having a high electric potential difference is partially or completely smeared to form the waterproof coating.

An electronic component having a high electric potential difference may be a component coupled with a power source or other component, which has a difference of electric potential higher than 12, 24, or 30 volts in some embodiments. For example, in a PCBA for batteries in automobiles, different groups of components may be connected with a power sources with different voltages including but not limited to 5, 12, 24, and 30 volts. For the components having a low electric potential difference (e.g., 5 volts), the nanofilm coating including the inner and the outer coatings as described herein may be used to provide protection from water or moisture and increase lifetime, while the surface of these components may be kept electrically conductive. A polymer based waterproof coating may not be necessarily needed. For the components having a high electric potential difference, surface conductivity may not be needed. The nanofilm coating including the inner and the outer coatings as described provide protection from water and moisture to a certain degree. However, a polymer based waterproof coating preferably provides better protection and much longer lifetime. Other examples of a component having a high electric potential difference may include light emitting diode (LED) lights for roadside and automotive uses.

In another aspect, the resulting device is provided in the present disclosure. The device comprises a printed circuit board assembly (PCBA), which includes a printed circuit board, and at least one electronic component disposed on the printed circuit board. A waterproof coating such as a polymer coating is disposed on or in contact with at least one portion of the at least one electronic component. A nanofilm is disposed on the PCBA. The nanofilm includes an inner coating and an outer coating. The inner coating is disposed on the printed circuit board or in contact with the waterproof coating. The inner coating comprises metal oxide nanoparticles having a particle diameter in a range of from about 5 nm to about 100 nm. The outer coating in contact with the inner coating, and comprises silicon dioxide nanoparticles having a particle diameter in a range of from about 0.1 nm to about 10 nm. In inner and outer coatings, nanoparticles may be bonded or fused together with each other. The nanoparticles may be in agglomerates. The metal oxide nanoparticles and silicon nanoparticles may be bonded or fused together with each other in the interface between the inner coating and outer coating.

The at least one electronic component comprises a component selected from a resistor, a capacitor, an inductor, a transistor, a diode, a connector, a speaker, a microphone, or any combination thereof. In some embodiments, the at least one electronic component comprises at least one pin electrically connecting with the printed circuit board, and the at least one pin is covered by the waterproof coating. The at least one electronic component may also comprise at least one electronic component having a high electric potential difference, and the waterproof coating is disposed thereon.

The waterproof coating comprises a polymer selected from the group consisting of silicone, acrylic, urethane, epoxy, fluoropolymer, polyolefin, rubber, chlorobutyl rubber, polyethylene rubber copolymer, and any combination thereof. The metal oxide nanoparticles include an oxide of one or more metals selected from Al, Ga, In, Sn, Tl, Pb, Bi, Sc, Ti, V, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, and Hg. In some embodiments, the metal oxide nanoparticles are $TiO_2$ nanoparticles. The inner coating and the outer coating may be in two-layer structure in some embodiments or interpenetrate with each other in some other embodiments.

In one aspect, a printed circuit board assembly (PCBA) is provided. The PCBA comprises a printed circuit board, at least one electronic component disposed on the printed circuit board, a waterproof coating disposed on or in contact with at least one portion of the at least one electronic component, and a nanofilm. The nanofilm includes an inner coating and an outer coating. The inner coating is disposed on the printed circuit board or in contact with the waterproof coating. The inner coating comprises metal oxide nanoparticles having a particle diameter in a range of about 5 nm to about 100 nm. The outer coating is in contact with the inner coating. The outer coating comprises silicon dioxide nanoparticles having a particle diameter in a range of from 0.1 nm to 10 nm. In some embodiments, the at least one electronic component comprises at least one pin electrically connecting with the printed circuit board, and the at least one pin is covered by the waterproof coating. The at least one electronic component comprises at least one electronic component having a high electric potential difference, and the waterproof coating is disposed thereon. The waterproof coating comprises a polymer, and the metal oxide nanoparticles are $TiO_2$ nanoparticles in some embodiments.

With reference to FIG. 1, a schematic diagram of an exemplary device such as 100 is shown. The exemplary device 100 comprises a printed circuit board assembly (PCBA) 10 and a nanofilm 4 coated on the PCBA 10. The PCBA 10 comprises a printed circuit board 1, and one or more electronic components 2 mounted thereon. In some embodiments, the peripheries and surfaces of the printed circuit board 1 and the electronic components 2 have a plurality of pores, gaps and other structures formed in manufacturing process, which make the PCBA 10 and the electronic components 2 rough. Each of the electronic components 2 has a plurality of pins 21 electrically connected with the printed circuit board 1. The pins comprise a conductive material such as a metal in some embodiments.

The electronic components 2 can be a resistor, a capacitor, an inductor, a transistor, a diode, a connector, a speaker, a microphone and any other components which can be mounted on the printed circuit board 1. The printed circuit board assembly 10 may be applied in a pack battery, a headset, a phone or any other electronic devices. The printed circuit board 1 is made from a FR-4 composite material, which is a glass-reinforced epoxy composite, in some embodiments.

At least one of the electronic components 2 may be partially or completely covered by a waterproof coating 3 (such as a polymer coating) so as to protect the electronic components 2 from being moistened. In some embodiments, when at least one of the electronic components 2 is selected from an electronic component 201 having a high electric potential difference, such an electronic component 2 needs to be coated by the waterproof coating 3. Preferably, the waterproof coating 3 is formed on the pins 21 of the electronic component 2 with a high electric potential difference. The waterproof coating 3 comprises a suitable material, which may be a polymer. Examples of such a polymer include, but are not limited to, silicone, acrylic or acrylate polymer, polyurethane, epoxy, fluoropolymer, polyolefin, rubber (e.g., chlorobutyl rubber), polyethylene rubber copolymer, or any other suitable polymer or combination thereof.

The nanofilm 4 includes an inner coating 41 comprising metal oxide nanoparticles and an outer coating 42 comprising silicon dioxide nanoparticles with a smaller diameter than that of the metal oxide nanoparticles. The inner coating 41 comprising metal oxide nanoparticles is disposed on or in contact with the printed circuit board 1 and the electronic components 2 of the PCBA 10. As illustrated in FIG. 1, at least one portion of the inner coating 41 may be disposed on or in contact with the waterproof coating 3 in some embodiments. The outer coating 42 comprising silicon nanoparticles is disposed on or in contact with the inner coating 41.

Figure 6:
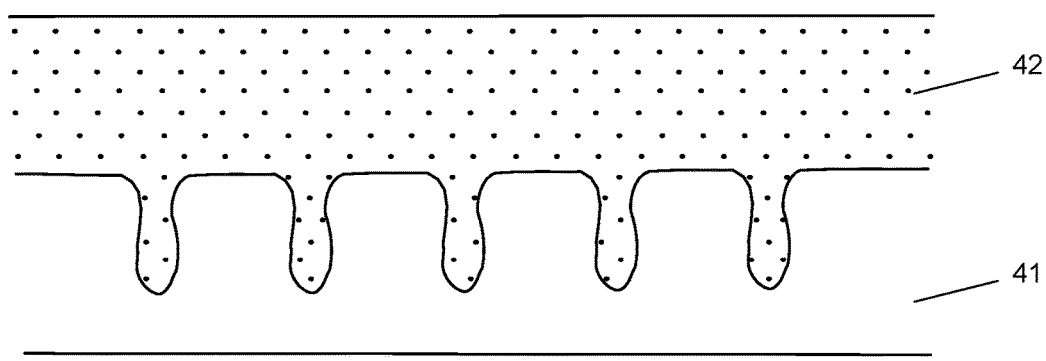
FIG. 6 is a schematic diagram illustrating an exemplary nanofilm structure, in which an exemplary inner coating and an exemplary outer coating interpenetrate with each other in some embodiments.

The shapes of the inner coating 41, the outer coating 42, and the PCBA 10 shown on FIG. 1 are merely schematic. In some embodiments, the periphery and/or the surface of the inner coating 41 has a plurality of tiny pores, gaps and other structures. When the outer coating 42 is formed on or inside the inner coating 41, interpenetration between the outer coating 42 and the inner coating 41 occurs, as illustrated in FIG. 6. The outer coating 42 and the inner coating 41 may not be in a form of two separate layers. In some embodiments, the metal oxide nanoparticles and the silicon dioxide nanoparticles can form the nanofilm 4 within the same layer. The silicon dioxide nanoparticles interpenetrate into the interstice between the metal oxide nanoparticles. A coating layer comprising both metal oxide particles and silicon dioxide particles is formed on the printed circuit board 1 and the electronic components 2 of the PCBA 10. The metal oxide nanoparticles of the inner coating 41 may also interpenetrate into the pores, gaps and other structures of the PCBA 10.

In some embodiments, the inner coating is made from a metal oxide nanoparticle solution. The metal oxide nanoparticle solution is a mixture of the metal oxide nanoparticles and a solvent. The metal oxide nanoparticles have diameters in a range of from about 5 nm to about 100 nm. The metal oxide nanoparticle solution has a concentration range from 0.3% to 5%. The solvent is selected from one of water, methanol, ethanol, the like or any combination thereof.

In some embodiments, the outer coating is made from a silicon dioxide nanoparticle solution. The silicon dioxide nanoparticle solution is a mixture of the silicon dioxide nanoparticles and a solvent. The silicon dioxide nanoparticles have diameters in a range of from about 0.1 nm to about 10 nm. The silicon dioxide nanoparticle solution has a concentration range from 0.3% to 5%. The solvent composition comprises heptane, cetane, methyl hydrogen siloxane, the like or any combination thereof in some embodiments. In some other embodiments, the solvent comprises amino modified siloxane or amino modified silane. Such amino modified siloxane or silane may optionally comprise —OH groups or may react with water or moisture to generate —OH groups.

Figure 2:
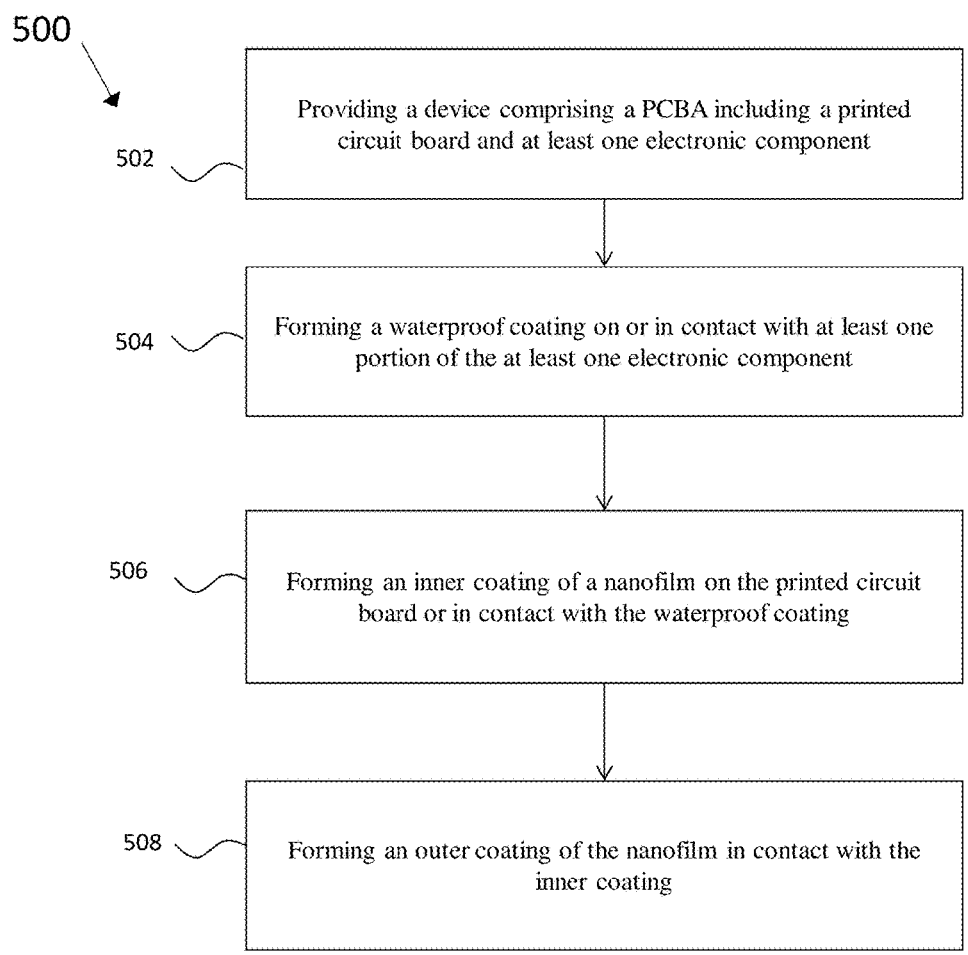
FIG. 2 is a flow chart showing an exemplary method for making a device in accordance with some embodiments of the present disclosure.
Figure 3:
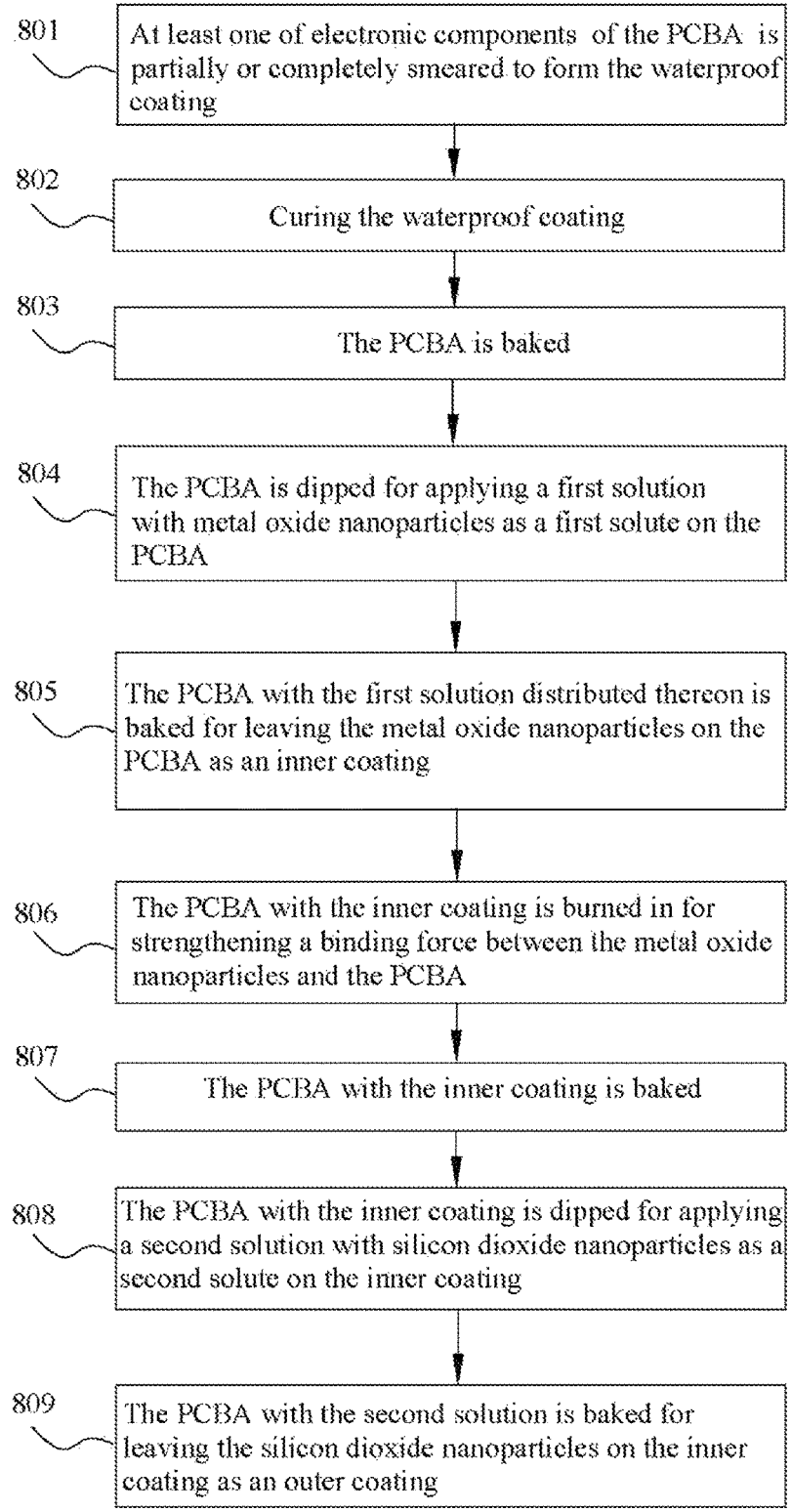
FIG. 3 is a flow chart showing an exemplary process for coating a PCBA or a device comprising a PCBA in accordance with some embodiments of the present disclosure.

Referring to FIG. 2, an exemplary method 500 comprises steps of providing a device comprising a PCBA including a printed circuit board and at least one electronic component disposed on the printed circuit board (step 502), forming a waterproof coating on or in contact with at least one portion of the at least one electronic component (step 504), forming an inner coating of a nanofilm on the printed circuit board or in contact with the waterproof coating (step 506), and forming an outer coating of the nanofilm in contact with the inner coating (step 508). FIG. 3 illustrates an exemplary method in details. Step 504 of FIG. 2 may include steps 801 and 802 of FIG. 3. Step 506 of FIG. 2 may include steps 804, 805, and 806 of FIG. 3. Step 508 of FIG. 2 may include steps 808 and 809 of FIG. 3.

With reference to FIG. 3, an exemplary process for coating the PCBA 10 is illustrated, according to some embodiments. The PCBA 10 is placed on a loader (not shown) for easy to execute later steps.

At step 801, at least one of electronic components 2 of the PCBA 10 is partially or completely smeared to form the waterproof coating 3, which may comprise a polymer coating material such as silicone, acrylic, urethane, epoxy, fluoropolymer, polyolefin, rubber (e.g., chlorobutyl rubber), polyethylene rubber copolymer, or any other suitable polymer or combination thereof. Optionally, the material for forming the waterproof coating 3 could be applied in a form selected from a solution, viscous liquid or colloid. The waterproof coating 3 is formed on the electronic component 2 by any operable technique such as spraying, brushing, spin-coating or selective-coating process. In general, the pins 21 of the high electric potential difference electronic component 201 are covered by the waterproof coating 3 so as to reinforce the waterproof function.

At step 802, the waterproof coating 3 is cured through a curing process. Examples of a suitable curing process include, but are not limited to, baking, UV irradiation, light curing, room temperature or low temperature curing, heat curing, and moisture curing. The methods for coating and curing may be selected according to the material type of the electronic component 2 and/or the characteristic of the material for forming the waterproof coating 3.

At step 803, the PCBA 10 is baked. The baking process can dry the PCBA 10 and activate or expose a plurality of pores, gaps and other structures of the PCBA 10. In some embodiments, the PCBA 10 is baked at a temperature in a range of from about 50° C. to about 150° C. for a period of time in a range of 10-30 minutes in a baking equipment (not shown).

At step 804, the PCBA 10 is dipped in automatic dipping machine (not shown) for applying a first solution with metal oxide nanoparticles as a first solute on the PCBA. In some embodiments, the PCBA 10 is dipped in the first solution for about 5-10 seconds. In some embodiments, the PCBA 10 may be spayed or brushed or other possible ways for replacing the dipping way. In some embodiments, the metal oxide nanoparticle solution includes a mixture of the metal oxide (e.g., $TiO_2$) nanoparticles and a first solvent. The metal oxide nanoparticles have diameters in a range of from about 5 nm to about 100 nm. In some embodiments, the concentration range of the first solution is from 0.3% to 5%.

At step 805, the PCBA 10 with the first solution distributed thereon is baked for forming the metal oxide nanoparticles on the PCBA 10 as an inner coating 41 by at least one of volatilization and pyrolysis of a first solvent of the first solution. Preferably, the PCBA 10 with the first solution is baked at a temperature in a range of from about 50° C. to about 150° C. for a period of time of about 5-30 minutes in a baking equipment (not shown). In some embodiments, the first solvent is one of water, methanol and ethanol (or any combination thereof), which can help the metal oxide nanoparticles more uniformly distributed on the PCBA 10. The PCBA 10 with the inner coating 41 is unloaded from the loader.

At step 806, the PCBA 10 with the inner coating 41 is burned in for strengthening a binding force between the metal oxide nanoparticles and the PCBA. In some embodiments, the PCBA 10 with the inner coating 41 is burned in at a temperate in a range of from about 25° C. to about 100° C. for a period of time in a range of 2-72 hours. Other ways the skilled artisan may use for strengthening the binding force between the metal oxide nanoparticles and the PCBA 10 can be also used. After being burned in, the PCBA 10 with the inner coating 41 is placed in a loader (not shown).

At step 807, the PCBA 10 with the inner coating 41 may be further optionally baked. The baking process can activate the plurality of pores, gaps and other structures of the inner coating 41. In some embodiments, the PCBA 10 with the inner coating 41 is baked at a temperature in a range of from about 50° C. to about 150° C. for 10-30 minutes in a baking equipment (not shown). In some embodiments, after the binding force between the metal oxide nanoparticles and the PCBA 10 is strengthened, before the PCBA 10 with the inner coating 41 is baked, a step of checking the appearance of the PCBA 10 with the inner coating 41 and cleaning the PCBA 10 with the inner coating 41 is included.

At step 808, the PCBA 10 with the inner coating 41 is dipped in automatic dipping machine for applying a second solution with silicon dioxide nanoparticles as a second solute on the inner coating 41. In some embodiments, PCBA 10 is dipped in the second solution for about 5-10 seconds. In some embodiments, the PCBA 10 may be spayed or brushed or other possible ways for replacing the dipping way. In some embodiments, the silicon dioxide nanoparticle solution includes a mixture of the silicon dioxide nanoparticles and a second solvent. The silicon dioxide nanoparticle solution may have a concentration in a range of from 0.3% to 5% of silicon dioxide having diameters in a range of from about 0.1 nm to about 10 nm. The second solvent of the second solution has a composition including heptane, cetane and methyl hydrogen siloxane or any combination thereof in some embodiments. In some other embodiments, the second solvent comprises amino modified siloxane or amino modified silane. The second solvent can help the silicon dioxide nanoparticles more uniformly distributed on the inner coating 41.

At step 809, the PCBA 10 with the second solution is baked for forming the silicon dioxide nanoparticles as an outer coating 42 on or in contact with the inner coating 41. In some embodiments, the PCBA 10 with the second solution is baked at a temperature in a range of from about 50° C. to about 150° C. for a period of time in a range of 10-30 minutes in a baking equipment (not shown). The PCBA 10 with the waterproof coating 3 and the nanofilm 4 is unloaded from the loader. The appearance and the function of the PCBA 100 are then examined.

In the present disclosure, all the temperature values are in degree C. (° C.). The percentages in the formulations are in weight percent (wt. %) even though volume percentages in the similar ranges are also acceptable. A size of the nanoparticles is a particle diameter on average based on particle size distribution.

In some embodiments, silica particles used are amorphous and hydrophobic. The silica particles (e.g., fumed silica) are obtained from a supplier, without any chemical modification. These particles provide desirable hydrophobicity in a coated surface. Optionally the silica particles may be chemically modified in some other embodiments.

Silica particles used may have some hydroxyl (—OH) groups on the surface. These hydroxyl groups may react with hydroxyl group on a surface of a substrate and/or metal oxide particles, and promote formation of covalent bonds to improve coating adhesion. Metal oxide and silicon oxide nanoparticles each may also have —OH groups to promote the formation of bonding within the inner or the outer coating. The metal oxide particle and the silica particles are also bonded or fused together as the interface between the inner coating and the outer coating. In some embodiments, silicon dioxide nanoparticles comprise methyl hydrogen siloxane grafted on the surface. Chemical group —Si—H in excess may react with moisture or water and is converted into —Si—OH, which will react with —Ti—OH on the metal oxide particles to form interfacial —Si—O—Ti bonds. The chemical groups —Si—OH and —Ti—OH may also make the nanoparticles fused or bonded together in the inner coating and the outer coating, respectively. In some other embodiments, silicon dioxide nanoparticles comprise amino modified siloxane or amino modified silane. Such amino modified siloxane or silane may optionally comprise —OH groups or may react with water or moisture to generate —OH groups. Similarly, the chemical groups —Si—OH reacts with —Si—OH or —Ti—OH to form —Si—O—Si— or —Si—O—Ti— bonds, respectively.

In the solution or suspension containing nanoparticles, a surfactant or dispersant is optionally used in some embodiments.

The total coating thickness of the nanofilm can be in nanometer to a few microns, for example, up to one micron or less than 200 nm in some embodiments. For example, the coating thickness of nanofilm 4 may be in a range of from about 5 nm to about 100 nm, about 10 nm to 20 nm, or any other suitable ranges. In some embodiments, the waterproof coating 3 may have a thickness in nanometer to a few microns, for example, up to one micron or less than 200 nm (e.g., about 5 nm-100 nm).

EXAMPLES

Nanofilm coatings were formed using the following two solutions (or mixtures or suspensions) after a waterproof polymer coating is formed. For example, the polymer coating can be formed by UV curing a cross linkable composition (e.g., Seal-glo 602 MCF) or by coating a silicone material (e.g., silicone 380B).

In the embodiments listed described below, the first solution comprises $TiO_2$ nanoparticles and the second solution comprises $SiO_2$ nanoparticles. The content of $TiO_2$ nanoparticles in the first solution is dispersed in the pure water which in a range from about 0.8 wt. % to about 1.5 wt. %. The first solution has a density of 1.01 g/cm$^3$. The content of $SiO_2$ nanoparticles in the second solution is dispersed in heptane, cetane and methyl hydrogen siloxane (about 0.1-5 wt. %), which is in a range from about 0.3 wt. % to about 5 wt. %. The second solution has a density of 0.774 g/cm$^3$. For example, in one exemplary process embodiment, a PCBA was coated with a polymer coating first and then baked at 50-150° C. for 10-30 minutes. The PCBA was cleaned with pure water at about 40-60° C. for 10-30 minutes. The cleaned PCBA was immersed in the first solution ($TiO_2$ nanoparticle solution) for about 5-10 seconds, followed by baked at 50-150° C. for 5-30 minutes and then at 25-100° C. for 7-12 hours. After preheated at 50-150° C. for 10-30 minutes, the PCBA was immersed in the second solution ($SiO_2$ nanoparticle solution) for 5-10 seconds. The PCBA was then baked at 50-100° C. for 10-30 minutes.

Figure 4A:
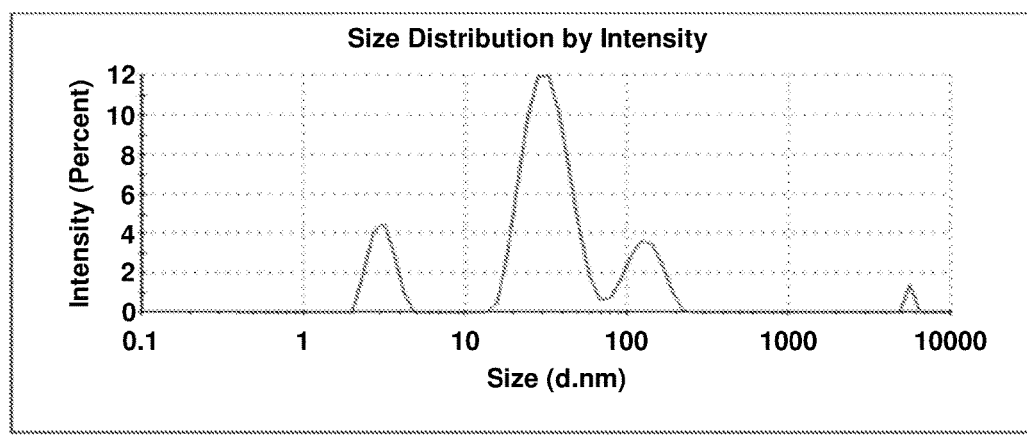
FIGS. 4A-4C illustrate measurement results of the particle size distribution of $TiO_2$ nanoparticles using dynamic light scattering (DLS) in accordance with some embodiments of the present disclosure.
Figure 4B:
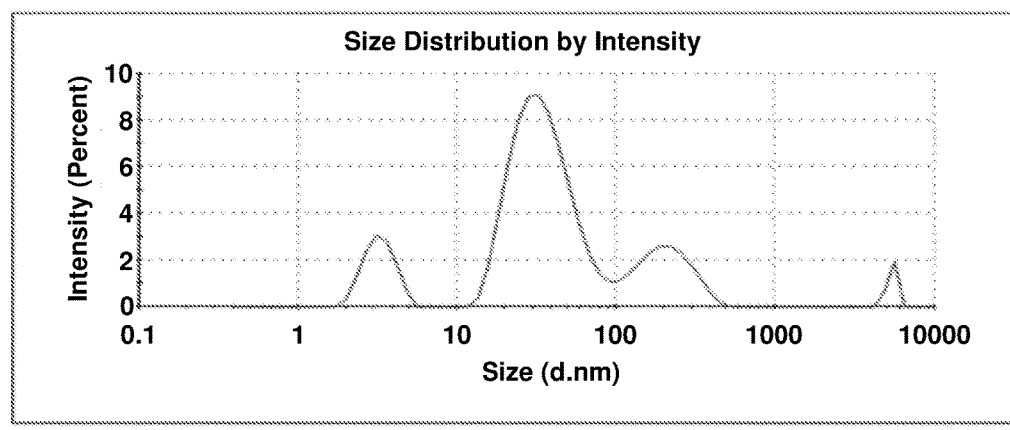
Figure 4C:
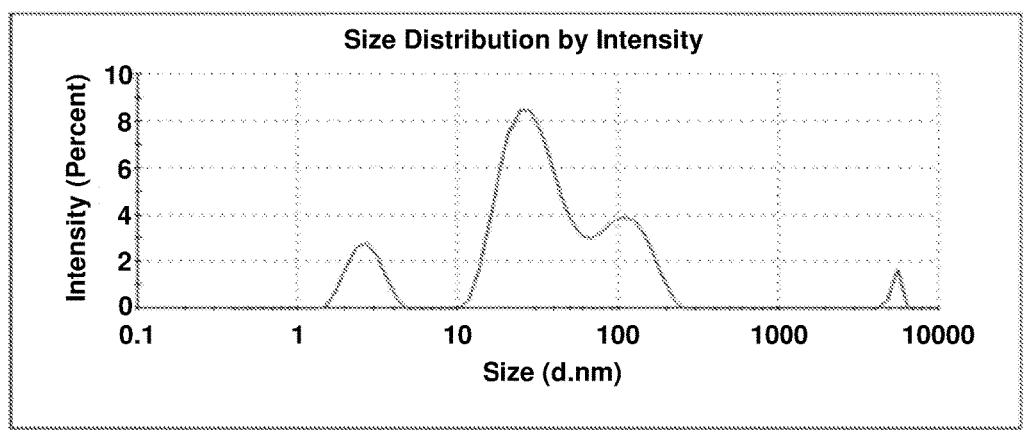
Figure 5:
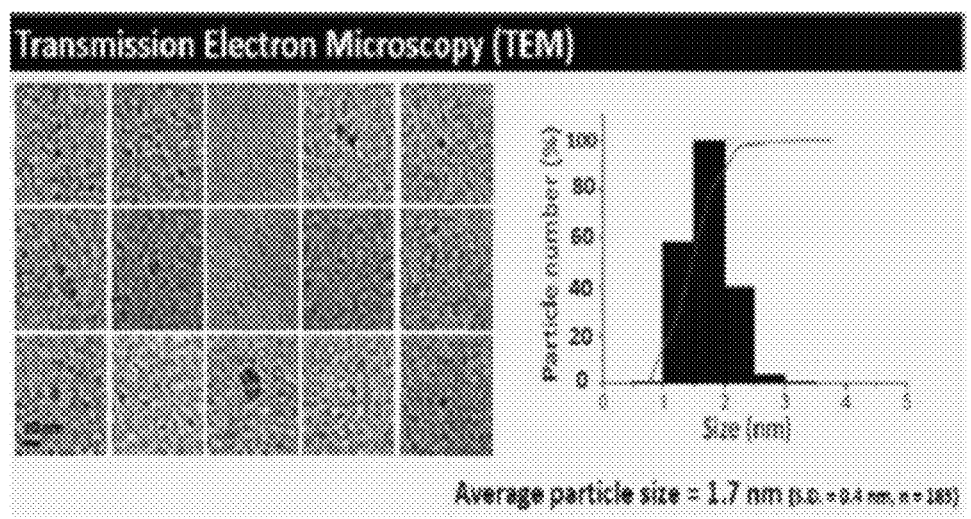
FIG. 5 is a transmission electron microscopy (TEM) image showing the particle size distribution of $SiO_2$ nanoparticles in accordance with some embodiments of the present invention.

The measurement results of the particle size distribution are shown in FIGS. 4A-4C and FIG. 5. FIGS. 4A-4C shows three measurement results of the particle size distribution of $TiO_2$ nanoparticles by dynamic light scattering (DLS). FIG. 5 shows a transmission electron microscopy (TEM) image of particle size distribution of $SiO_2$ nanoparticles.

Three measurement results of the particle size distribution of $TiO_2$ nanoparticles by DLS are respectively shown in FIGS. 4A, 4B and 4C. $TiO_2$ nanoparticles with the majority of particle size (diameter) in a range of from about 32 nm to 36 nm, a second particle size peak around about 110 nm to 220 nm and a third particle size peak around about 2.6 nm to 3.3 nm. Referring to FIG. 5, $SiO_2$ nanoparticles have a particle size (diameter) in a range of from 1 nm to 2.5 nm (average size 1.7 nm±0.4 nm).

A thickness of the nanofilm coated on the device can be from few nanometers to few microns, such as from 10 nm to 1 micron. The nanofilm may be composed of the titanium dioxide nanoparticles and the silicon dioxide nanoparticles. The diameter of silicon dioxide nanoparticles is smaller than that of titanium dioxide nanoparticles. The nanofilm consisting of larger titanium dioxide nanoparticles and smaller silicon dioxide nanoparticles exhibits hierarchical structure and high surface roughness, leading to the superhydrophobic property. The water contact angle θ of the nanofilm on the device surface is in a range of 90°<θ<150°. In some embodiments, the nanofilm can make the device surface have less friction or other functions. A contact angle θ between the water droplet and the glass substrate coated with the nanofilm is 128±2°. Generally, θ≥90°, or θ≥110°, or θ≥130°, or 150≥θ≥110°, or 150≥θ≥90°.

The preparation of the first and second solutions, and some aspects of the inner coating and the outer coating are described in a co-pending U.S. application Ser. No. 15/342,722 filed Nov. 3, 2016, and a co-pending U.S. application Ser. No. 15/612,182 filed Jun. 2, 2017, which are incorporated by reference herein.

Hereinafter, the performance of a PCBA with nanofilm in some embodiments of the present invention is explained with reference to test results.

Water Proof Test I.

Four light emitting diode (LED) modules were used for testing. Each of the LED modules is a PCBA. Two LED modules with no nanofilm or waterproof coating were used as controls. Two other LED modules were coated with a waterproof coating 3 and a nanofilm 4. Each LED module was put into water, and then powered up. The working time of each LED module was recorded until the LED module stopped working. The testing results shown in Table 1 have confirmed that the nanofilm and the waterproof coating effectively provide waterproof function to protect LED modules.

Referring to Table 1, the average working time of an original LED module without a nanofilm and a waterproof coating under water is 2 minutes. However, the average working time of the LED module with a nanofilm and a waterproof coating under the water is 29 hours and 45 minutes. Therefore, the LED module with a nanofilm and a waterproof coating effectively achieves the waterproof function and significantly extends the waterproof time.

TABLE 1

| | Testing Samples | | |
|---|---|---|---|
| | Original (without nanofilm and waterproof coating) | | With nanofilm and waterproof coating |
| | No. 1 | No. 2 | No. 3 | No. 4 |
| Test time | After 1 minutes, LED not working | After 3 minutes, LED not working | After 30 hours and 8 minutes, LED not working | After 29 hours and 23 minutes, LED not working |
| Avg. | 2 minutes | | 29 hours and 45 minutes | |

Water Proof Test II.

Ten earphones were used to test waterproof function. Each of the earphones had a PCBA and a speaker. Five PCBAs were coated with a waterproof coating (3) and a nanofilm (4) while the other PCBAs had no nanofilm or waterproof coating. The PCBA of the earphone were put into water. The PCBA was then connected with a mobile phone by Bluetooth technology to operate the play function, but the speaker was not put under the water. The play time of each earphone was recorded until the earphone stopped working. If the earphone stopped working, an examination was made to check whether the PCBA of such an earphone was broken or not. If the reason was the Bluetooth problem, the PCBA was reconnected to the mobile phone for continued testing. As shown in Table 2, the average working time of the earphones having a PCBA without nanofilm or waterproof coating (i.e. the controls) under the water was 58.4 minutes. In contrast, the average working time of the earphones having a PCBA coated with a waterproof coating (3) and a nanofilm (4) under the water is 1,891 minutes. Therefore, the waterproof coating (3) and the nanofilm (4) effectively provide waterproof function and protection to the PCBA.

TABLE 2

| | Testing Samples | | | | | | | | | |
|---|---|---|---|---|---|---|---|---|---|---|
| | Original (without nanofilm and waterproof coating) | | | | | With nanofilm and waterproof coating | | | | |
| | No. 1 | No. 2 | No. 3 | No. 4 | No. 5 | No. 6 | No. 7 | No. 8 | No. 9 | No. 10 |
| Test time (minutes) | 63 | 52 | 34 | 71 | 72 | 2011 | 1762 | 1702 | 2168 | 1814 |
| Avg. (minutes) | | | 58.4 | | | | | 1891 | | |

The process for coating a waterproof coating and a nanofilm can be applied in other devices by a person ordinarily skilled in the art, maybe has other advantages, such as a cable which may be connected with a PCBA or not. When the cable is connected with the PCBA, the cable and the PCBA are coated simultaneously. After, the coating process, the cable has a good waterproof effect and a smaller friction force. The temperatures and the times of baking and burning in may be different in coating different devices, some detail of steps may be different. In the present invention, the word degree means degree centigrade. The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A device, comprising:
   a printed circuit board assembly including:
      a printed circuit board, and
      at least one electronic component disposed on the printed circuit board;
   a waterproof coating disposed on or in contact with at least one portion of the at least one electronic component;
   a nanofilm disposed on the printed circuit board assembly, the nanofilm including:
      an inner coating disposed on the printed circuit board or in contact with the waterproof coating, the inner coating consisting essentially of metal oxide nanoparticles having a particle diameter in a range of about 5 nm to about 100 nm; and
      an outer coating in contact with the inner coating, the outer coating consisting essentially of silicon dioxide nanoparticles having a particle diameter in a range of 0.1 nm to 10 nm.

2. The device of claim 1, wherein the at least one electronic component comprises a component selected from a resistor, a capacitor, an inductor, a transistor, a diode, a connector, a speaker, a microphone, or any combination thereof.

3. The device of claim 1, wherein the at least one electronic component comprises at least one pin electrically connecting with the printed circuit board, and the at least one pin is covered by the waterproof coating.

4. The device of claim 1, wherein the at least one electronic component comprises at least one electronic component having a high electric potential difference, and the waterproof coating is disposed thereon.

5. The device of claim 1, wherein the waterproof coating comprises a polymer selected from the group consisting of silicone, acrylic, urethane, epoxy, fluoropolymer, polyolefin, rubber, chlorobutyl rubber, polyethylene rubber copolymer, and any combination thereof.

6. The device of claim 1, wherein the metal oxide nanoparticles include an oxide of one or more metals selected from Al, Ga, In, Sn, Tl, Pb, Bi, Sc, Ti, V, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, and Hg.

7. The device of claim 1, wherein the metal oxide nanoparticles are $TiO_2$ nanoparticles.

8. The device of claim 1, wherein the inner coating and the outer coating interpenetrate with each other.

9. A printed circuit board assembly (PCBA), comprising:
   a printed circuit board,
   at least one electronic component disposed on the printed circuit board;
   a waterproof coating disposed on or in contact with at least one portion of the at least one electronic component; and
   a nanofilm including:
      an inner coating disposed on the printed circuit board or in contact with the waterproof coating, the inner coating consisting essentially of metal oxide nanoparticles having a particle diameter in a range of about 5 nm to about 100 nm; and
      an outer coating in contact with the inner coating, the outer coating consisting essentially of silicon dioxide nanoparticles having a particle diameter in a range of 0.1 nm to 10 nm.

10. The PCBA of claim 9, wherein the at least one electronic component comprises at least one pin electrically connecting with the printed circuit board, and the at least one pin is covered by the waterproof coating.

11. The PCBA of claim 9, wherein the at least one electronic component comprises at least one electronic component having a high electric potential difference, and the waterproof coating is disposed thereon.

12. The PCBA of claim 9, wherein the waterproof coating comprises a polymer, and the metal oxide nanoparticles are TiO2 nanoparticles.

\* \* \* \* \*